United States Patent [19]

Akagawa

[11] Patent Number: 5,131,800
[45] Date of Patent: * Jul. 21, 1992

[54] MANUALLY OPERABLE APPARATUS FOR TRANSFERRING DISKS BETWEEN CASSETTES

[75] Inventor: Minoru Akagawa, Fremont, Calif.

[73] Assignee: Intelmatec Corporation, Fremont, Calif.

[*] Notice: The portion of the term of this patent subsequent to Sep. 18, 2007 has been disclaimed.

[21] Appl. No.: 514,124

[22] Filed: Apr. 25, 1990

Related U.S. Application Data

[63] Continuation-in-part of Ser. No. 349,399, May 8, 1989, Pat. No. 4,957,406.

[51] Int. Cl.$^5$ ............................................. B65G 65/04
[52] U.S. Cl. ............................................. 414/416; 414/404; 414/750; 414/908; 294/87.1; 294/158
[58] Field of Search ............... 414/403, 404, 416, 749, 414/750, 908; 294/87.1, 158

[56] References Cited

U.S. PATENT DOCUMENTS

| | | | |
|---|---|---|---|
| 1,012,192 | 12/1911 | Corkery | 294/87.1 X |
| 2,698,765 | 1/1955 | Eagle | 294/87.1 |
| 2,874,991 | 2/1959 | Cushman | 294/87.1 |
| 3,542,224 | 11/1970 | Warren | 414/416 |
| 3,805,943 | 4/1974 | Warren | 414/416 X |
| 3,920,128 | 11/1975 | Baker | 414/416 X |
| 3,929,234 | 12/1975 | Warren | 414/416 X |
| 4,449,885 | 5/1984 | Hartel et al. | 414/750 |
| 4,569,625 | 2/1986 | Dorumsgaard et al. | 414/750 X |
| 4,573,851 | 3/1986 | Butler | 414/404 |
| 4,597,819 | 7/1986 | Kusuhara et al. | 414/331 X |
| 4,645,401 | 2/1987 | Hopkins | 414/416 X |
| 4,787,806 | 11/1988 | Aupperle | 414/416 |
| 4,856,957 | 8/1989 | Lau et al. | 414/404 |
| 4,958,982 | 9/1990 | Chempet et al. | 414/404 X |
| 5,007,788 | 4/1991 | Asano et al. | 414/404 X |

FOREIGN PATENT DOCUMENTS 236714 6/1986 Fed. Rep. of Germany ...... 414/416

Primary Examiner—Robert J. Spar
Assistant Examiner—Robert S. Katz
Attorney, Agent, or Firm—Heller, Ehrman, White & McAuliffe

[57] ABSTRACT

A manually operable apparatus is provided for transferring disks with center holes such as semiconductor wafers from one cassette of an ordinary kind to another having a different pitch. The apparatus has an elongated rod on which an array of disk-shaped pieces each capable of supporting a wafer from its center hole is slidably mounted. These pieces are so connected that the separation between each of mutually adjacent pairs can vary but not to exceed a predetermined maximum distance. The piece at one end of the array is affixed to the rod and the one at the other end is attached to a tubular member which can be moved manually in the direction of the rod.

10 Claims, 2 Drawing Sheets

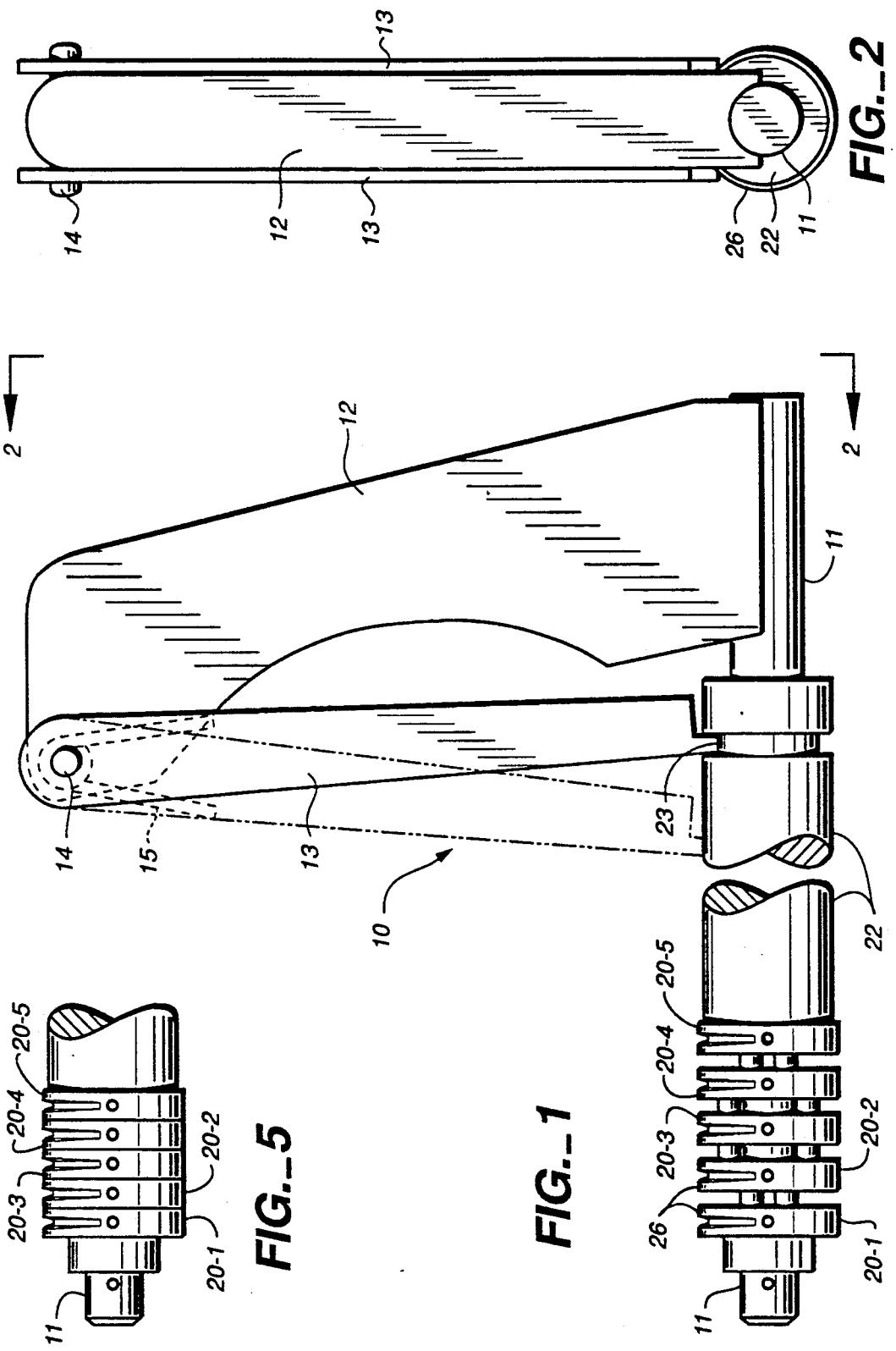

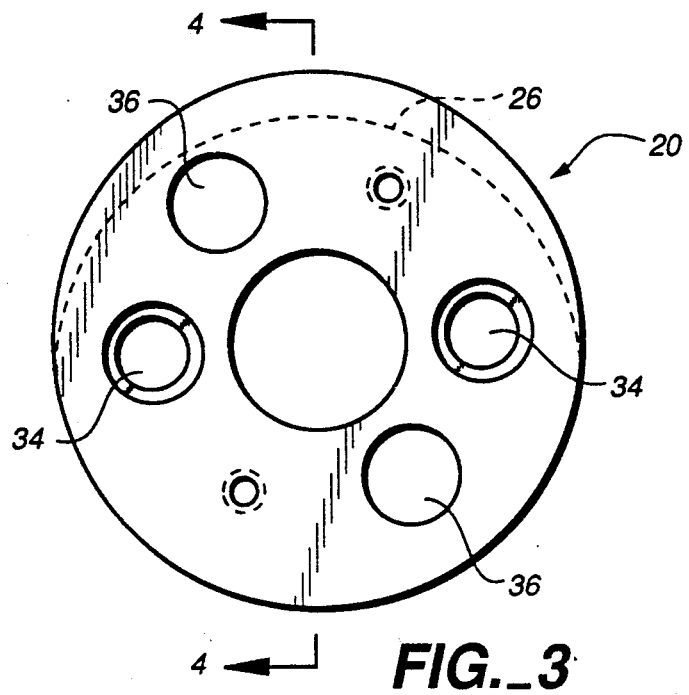
FIG._3
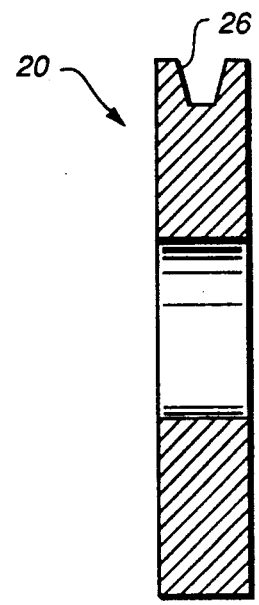
FIG._4
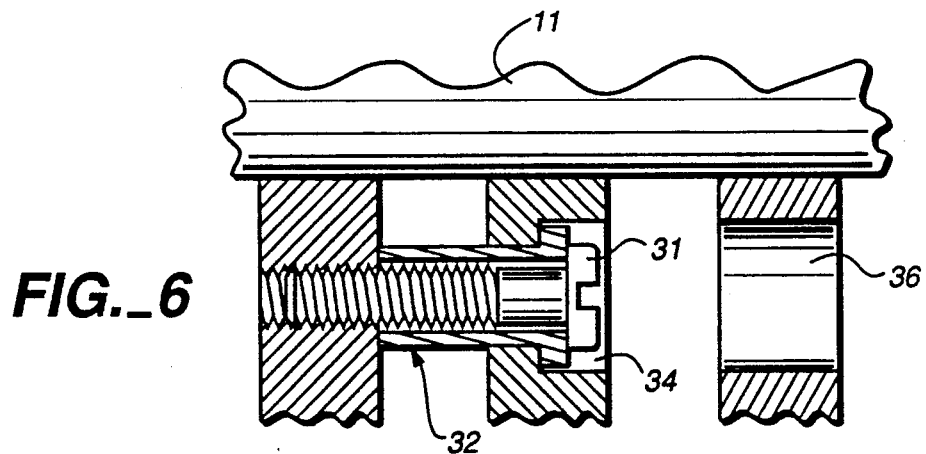
FIG._6
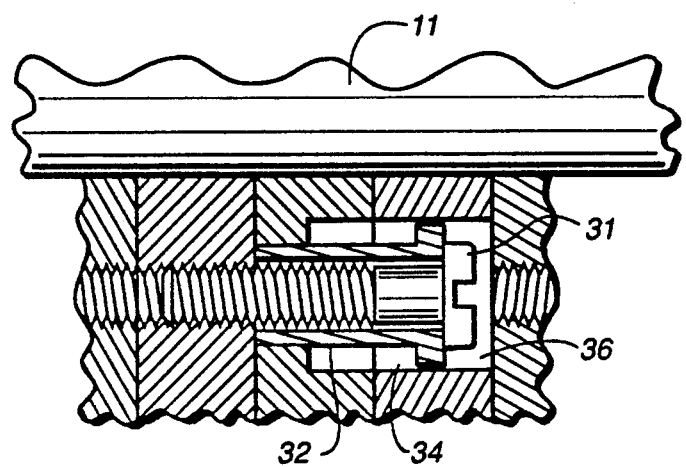
FIG._7

MANUALLY OPERABLE APPARATUS FOR TRANSFERRING DISKS BETWEEN CASSETTES

This is a continuation-in-part of application Ser. No. 349,399 filed May 8, 1989.

BACKGROUND OF THE INVENTION

This invention relates to a manually operable apparatus for transferring disks such as semiconductor wafers, each having a hole of a specified size at the center, from one cassette of a conventional type to another cassette of a similar conventional type but having a different pitch.

Semiconductor wafers are fragile or otherwise easily rendered useless by contamination or abrasion. Therefore, they are usually carried in a cassette for transporting from one work station to another during processing. A cassette used for such a purpose is shaped generally like a box or a cage with a bottom opening, having walls with grooves at a constant pitch as disclosed, for example, in U.S. Pat. No. 4,311,427 issued Jan. 19, 1982, U.S. Pat. No. 4,471,716 issued Sep. 18, 1984, U.S. Pat. No. 4,493,418 issued Jan. 15, 1985 and U.S. Pat. No. 4,743,156 issued May 10, 1988. A plurality of (typically 25) disks are positioned in such a cassette, maintained vertically and parallel to one another. In order to save space, wafers in such a cassette are separated from one another only by a small distance of typically about a quarter of an inch. When the wafers undergo a washing process, however, individual wafers cannot be washed effectively if they are aligned so close to one another. For this reason, another cassette is usually provided for such a purpose with wafer-supporting grooves on the walls separated by a larger distance, say, about one-half inch. Thus, wafers which have been brought to a washing station are taken out in a piece-by-piece fashion from their usual cassette used generally for their transportation and transported into this specially provided cassette with grooves spaced wider apart. Transferring wafers thus from one cassette to another with a different pitch is a troublesome procedure, whether done manually or by a robot.

U.S. patent application Ser. No. 349,399 filed May 8, 1989, now U.S. Pat. No. 4,957,406 discloses a motor-driven apparatus with which wafers can be easily transferred from one cassette to another having a different pitch. Such a motor-driven apparatus is heavy, bulky and not convenient under certain circumstances.

SUMMARY OF THE INVENTION

It is therefore an object of the present invention to provide a manually operable compact apparatus for efficiently transferring disks such as semiconductor wafers having center holes from one cassette of a conventional type having walls with disk-supporting grooves to another cassette similarly structured but having grooves with a different pitch.

An apparatus embodying the present invention with which the above and other objects hereof can be achieved is characterized as having an elongated rod for passing through the well aligned center holes of wafers placed regularly in such a cassette. An array of a plurality of serially concatenated, generally disk-shaped wafer-supporting pieces is mounted to this rod. One of these pieces at one end of the array is secured to the rod but the others are slidable longitudinally therealong. Each mutually adjacent pair of these serially concatenated pieces in the array is connected together but not rigidly such that the separation between these pairs is variable without exceeding a predetermined maximum distance. Each of these pieces is formed with a groove at the top for accepting therein from above an inner periphery of a wafer so as to support the wafer by its center hole. The piece at the other end of the array is attached to a tubular sleeve-like member coaxially surround the rod. As this sleeve-like member is manually pushed longitudinally along the direction of extension of the rod, these mutually concatenated wafer-supporting pieces are either pushed together or pulled away from one another to assume a predetermined distance between each mutually adjacent pair thereof.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a partially sectional side view of an apparatus embodying the present invention, FIG. 2 is a back view of the apparatus of FIG. 1 taken along the line 2—2 of FIG. 1, FIG. 3 is a plan view of one of the wafer-supporting pieces, FIG. 4 is a sectional view of the piece taken along the line 4—4 of FIG. 3, FIG. 5 is a portion of FIG. 1 when the wafer-supporting pieces are pressed against one another, FIG. 6 is a sectional view of a portion of three mutually adjacent ones of the wafer supporting pieces for showing their connecting mechanism when the pieces are pulled away from one another, and FIG. 7 is a sectional view of a portion of the same three pieces shown in FIG. 6 when they are pressed against one another.

DETAILED DESCRIPTION OF THE INVENTION

FIGS. 1 and 2 show a manually operable apparatus 10 embodying the present invention for transferring disks having center holes such as semiconductor wafers from a cassette of a conventional structure having walls with disk-supporting grooves formed at a first pitch to another similarly structured cassette with disk-supporting grooves formed at a second pitch which is different from the first pitch. Without loss of generality, it will be assumed hereinbelow that the first pitch is smaller than the second pitch. The apparatus has an elongated rod 11 affixed to a base member 12 serving as the handle, the rod 11 extending horizontally (when the apparatus is about to be used under a normal circumstance) therefrom. A plural number (five according to the embodiment shown in FIG. 1) of generally thin, disk-shaped wafer-supporting pieces 20-1, 20-2, . . . , 20-5 (or 20, when collectively referred to) are vertically mounted on the rod 11 serially, the first of these pieces (20-1) being affixed to the rod 11 near its protruding end distal from the base member 12 but the others of these pieces 20-2, 20-3, ... having a throughhole for passing the rod 11 therethrough and being slidable longitudinally along the rod 11 without rotating therearound. The last of these pieces (20-5) is affixed to a tubular sleeve-like member 22 which is provided with an internal retainer ring and a linear ball bearing (not shown) so as to be freely slidable longitudinally along the rod 11.

The rod 11 with the supporting pieces 20 mounted thereon is intended to be inserted penetratingly through the well aligned center holes of wafers supported in a cassette of a conventional design. For this reason, the area of each supporting piece 20 as seen longitudinally is smaller than that of the center hole of the wafers. Since each of the supporting pieces 20 is intended to lift one of the wafers in the cassette by support it by its internal edge, each disk-shaped supporting piece 20 is provided with a sectionally V-shaped groove 27 at a top part as shown more clearly in FIGS. 3 and 4 for dependably accepting the inner peripheral edge of a wafer bordering upon its center hole.

The wafer-supporting disk-shaped pieces 20 are serially concatenated to one another in such a way that the separation between each mutually adjacent pair thereof can change between a minimum value (corresponding to the aforementioned first pitch) and a specified maximum value (corresponding to the aforementioned second pitch). In other words, the connections of these pieces 20 are not rigid. Throughout herein, it is to be understood that the separation between mutually adjacent ones of these pieces 20 is defined as the distance by which two wafers supported thereby in their grooves 26 are separated. Thus, the aforementioned minimum value is basically determined by the thickness of each piece 20 because the grooves 26 are similarly formed in all of the pieces 20 and the minimum separations occur when the pieces 20 are all pressed together as shown in FIG. 5. FIG. 1, by contrast, shows the apparatus 10 when the separations of the mutually concatenated pieces 20 are at the maximum corresponding to the second pitch. The mechanism by which the disk-shaped pieces 20 are connected together is explained next by way of FIG. 6 showing three of them 20-i, 20-(i+1) and 20-(i+2) which are mutually adjacent to each other (i being an dummy index between 1 and 3, inclusive). For the convenience of explanation, these three representative pieces are referred to as the first piece, the second piece and the third piece, respectively.

With reference still to FIG. 6, numeral 31 indicates a pan head screw adjustably attached to the first piece 20-i, protruding horizontally towards the second piece 20-(i+1). As shown in FIG. 4, two of these screws 31 are attached at diametrically opposite positions but only one of them is shown in FIG. 6 for the purpose of describing the connection mechanism. With reference back to FIG. 6, numeral 32 indicates a sleeve through which the screw 31 is passed and the second piece 20-(i+1) is provided with throughholes 34 as shown in FIG. 3 for the screws 31 and the sleeves 32 to pass through. Each of the throughholes 34 has a smaller diameter on the side opposite the first piece 20-i than on the side opposite the third piece 20-(i+2), the diameter changing abruptly in the middle. The sleeve 32 has its end distal from the first piece 20-i extending radially outward such that this radially extending end part can pass through the wider part of the throughhole 34 but not through the narrower part. Thus, the maximum separation between the first piece 20-i and the second piece 20-(i+1) occurs when the radially extending part of the sleeve 32 backed by the head of the screw 31 comes into contact with the center part of the throughhole 34 where its inner diameter changes abruptly as shown in FIG. 6. The third piece 20-(i+2) is provided with throughholes 36 each with diameter large enough to allow the head of the screw 31 and the protruding end of the sleeve 32 to pass through. This is such that these three pieces can be pressed against one another as shown in FIG. 7 to minimize the separations therebetween.

In connection with the explanation of the connection mechanism given above, it is to be understood that i is a dummy index. In other words, although the end pieces 20-1 and 20-5 can only play the role of the first piece and the third piece, respectively, the piece 20-2 simultaneously plays the role of the first piece with the pieces 20-3 and 20-4 and that of the second piece with the pieces 20-1 and 20-3, the piece 20-3 simultaneously plays the role of the first piece with the pieces 20-4 and 20-5, that of the second piece with the pieces 20-2 and 20-4 and that of the third piece with the pieces 20-1 and 20-2, and the piece 20-4 simultaneously plays the role of the second piece with the pieces 20-3 and 20-5 and that of the third piece with the pieces 20-2 and 20-3. This can be seen, for example, in FIG. 3 which shows the center one of the pieces 20 having not only two screws 31 attached thereto (serving as the first piece) but also throughholes of two kinds 34 and 36 (serving as the second and third pieces). In order to be able to play these three roles simultaneously, the center piece 20-3 has a pair of diagonally oppositely positioned screws 31, a pair of diagonally oppositely positioned throughholes 34 with internal steps and a pair of diagonally oppositely positioned throughholes 36 without internal steps, each of these diagonally oppositely positioned pairs being in mutually rotated positional relationship with 60-degree intervals therebetween as shown in FIG. 3. For example, the screws 31 attached to one of the pieces 20 and those attached to its adjacent piece are in an angularly displaced relationship by 60 degrees. This holds similarly with respect to the throughholes 34 and 36 formed in mutually adjacent pairs of the pieces 20.

As shown in FIG. 1, the base member 12 serving as a handle for the use of this apparatus is securely affixed to the rod 11, extending transversely from its direction of extension. An elongated trigger piece 13 is rotatably supported by the base member 12 around an axis 14 distal from the rod 11. A spring 15 of a known kind is provided around this axis 14 so as to apply a biasing force on the trigger piece 13 in the (forward) direction away from the base member 12. The tubular sleeve-like member 22 is provided with a groove 23 for engagingly holding therein the free end of the trigger piece 13 distal from the axis 14 such that the biasing force of the spring 15 causes the trigger piece 13 to push the tubular member 22 forward as indicated by broken lines in FIG. 1 and thereby to press the wafer-supporting pieces 20 together as shown in FIGS. 5 and 7.

When the user, while holding the apparatus by the base member 12, pulls the trigger piece 13 toward the base member 12, the tip of the trigger piece 13 engaging the groove 23 causes the tubular sleeve-like member 22 to move backward towards the base member 12 against the biasing force of the spring 15. This causes the mutually concatenated wafer-supporting pieces 20 to be pulled apart as shown in FIGS. 1 and 6.

Let us now consider a typical situation where wafers are placed on a cassette of a conventional kind for transporting them from one work station to another, that is, a cassette with walls having grooves formed at a relatively small pitch of, say, 0.25 inch. What is desired now is to transfer these wafers from this cassette to another one having grooves formed at a larger pitch of, say, 0.5 inch. For this purpose, the apparatus 10 described above is so dimensioned that the separation of mutually adjacent pairs of these wafer-supporting pieces 20, or the separation between their grooves 26 when the pieces 20 are pressed together as shown in FIG. 5 is 0.25 inch and that the screws 31 are so adjusted that the separations between mutually adjacent grooves 26 can increase to 0.5 inch.

With the wafer-supporting pieces 20 assuming the bunched-up relative positions as shown in FIG. 5 by the biasing force of the spring 15 as explained above, the separations between their grooves 26 are uniformly 0.25 inch. With the pieces 20 in this bunched-up condition, the rod 11 is inserted through the tunnel formed by the well aligned center holes of the wafers placed on the aforementioned cassette of the conventional type having a small predetermined pitch (of 0.25 inch). For this to be possible, it is understood that the surface areas of the pieces 20 and the tubular sleeve-like member 22 are sufficiently small and this sleeve-like member 22 is sufficiently long with respect to the length of the wafer-carrying cassette.

With the pitch of the wafers in the cassette matching that of the grooves 26 as explained above, up to five mutually adjacent ones of the wafers in this cassette can be lifted up, their inner peripheries falling into the corresponding grooves 26, as the rod 11 is raised vertically upward. After the wafers are completely out of the cassette, supported entirely by the apparatus 10, the user pulls the trigger piece 13 backward towards the base member 12, causing also the tubular sleeve-like member 22 to slidingly move backward. As explained above, this causes the wafer-supporting pieces 20 to be pulled apart until the separations between mutually adjacent pairs of the pieces 20 reach their maximum value which, in this case, is set to 0.5 inch. In other words, the bunched-up pieces 20 come apart one by one until each mutually adjacent pair thereof comes to be separated by 0.5 inch. With the wafers thus separated at an increased pitch, they can be lowered into the other cassette with grooves formed at this increased pitch.

The foregoing description of a preferred embodiment of the invention has been presented for purposes of illustration and description. It is not intended to be exhaustive or to limit the invention to the precise form disclosed, and many modifications and variations are possible in light of the above teaching. For example, the number of the wafer-supporting pieces 20 may be changed and the base member 12 need not be shaped exactly as illustrated in FIG. 1. Any other mechanism for concatenating the plurality of wafer-supporting pieces may be substituted if it can serve the purpose of limiting the distance of separation between mutually adjacent pairs thereof between a predetermined minimum value and a predetermined maximum value corresponding to the pitches of grooves on cassettes between which wafers are desired to be transferred. The minimum and maximum separations given above are merely for purposes of illustration. Any such modifications and variations that may be apparent to a person skilled in the art are intended to be included within the scope of this invention.

What is claimed is:

1. A manually operable apparatus for transferring disks with center holes from one cassette to another having a different pitch, said apparatus comprising
    a rod elongated in a longitudinal direction, an array of a plurality of serially concatenated disk-supporting pieces each of which supports one of said disks by an edge of the center hole thereof, one of said disk-supporting pieces at one end of said array being affixed to said rod and the rest of said disk-supporting pieces being supported by said rod slidably along said longitudinal direction,
    connecting means each connecting together one of mutually adjacent pairs of said serially concatenated disk-supporting pieces such that the separation between each mutually adjacent pair of said disk-supporting pieces is variable but cannot exceed a predetermined maximum length, and
    manually operable means adjacent the other end of said array for causing a closest one of said disk-supporting pieces to slidingly move along said rod, whereby said rod with said disk supporting pieces may pick up disks from one cassette, change the pitch of said disks, and then deposit the disks into another cassette.

2. The apparatus of claim 1 wherein each of said disk-supporting pieces has a groove which extends perpendicularly to said rod and is capable of accepting thereinto said edge of the center hole of a disk.

3. The apparatus of claim 1 wherein said manually operable means is rigidly connected to said closest one of said disk-supporting pieces at said other end of said array.

4. The apparatus of claim 3 wherein said manually operable means includes a tubular sleeve-like member disposed around said rod and serves to move in said longitudinal direction.

5. The apparatus of claim 1 wherein said connecting means include screws each having an enlarged head, protrudingly attached to one of said disk-supporting pieces, extending parallel to said rod and penetrating a throughhole formed in adjacent one of said disk-supporting pieces, said throughhole being smaller at least in part than said enlarged head.

6. The apparatus of claim 5 wherein those of said screws attached to mutually adjacent ones of said pieces are not colinearly disposed with respect to each other.

7. The apparatus of claim 5 wherein nearly all of said pieces are further provided with a throughhole large enough for said enlarged head to pass through.

8. The apparatus of claim 2 wherein said groove is sectionally V-shaped.

9. The apparatus of claim 2 wherein said disk-supporting pieces and said connecting means are so dimensioned that the separations between two of said grooves on two of mutually adjacent ones of said disk-supporting pieces are uniform and equal to a first predetermined distance when said manually operable means moves said pieces as far as possible in a first direction along said rod and uniform and equal to a second predetermined distance when said driving means moves said pieces as far as possible in a second direction along said rod opposite said first direction.

10. The apparatus of claim 1 further comprising biasing means for applying a biasing force on said manually operable means in said longitudinal direction.

* * * * *